United States Patent [19]

Jetter

[11] Patent Number: 4,881,010

[45] Date of Patent: Nov. 14, 1989

[54] ION IMPLANTATION METHOD AND APPARATUS

[75] Inventor: Neil R. Jetter, Palm Beach, Fla.

[73] Assignee: Harris Semiconductor Patents, Inc., Melbourne, Fla.

[21] Appl. No.: 148,209

[22] Filed: Jan. 22, 1988

Related U.S. Application Data

[63] Continuation of Ser. No. 793,233, Oct. 31, 1985, abandoned.

[51] Int. Cl.[4] ............................................. H01J 7/24
[52] U.S. Cl. ........................... 315/111.81; 315/111.91; 313/362.1; 427/38
[58] Field of Search ...................... 315/111.81, 111.91; 313/362.1, 231.01; 427/38, 255, 255.1, 255.2, 25, 26; 437/25, 26, 27, 930, 935; 250/432, 282

[56] References Cited

U.S. PATENT DOCUMENTS

| | | | |
|---|---|---|---|
| 3,075,115 | 1/1963 | Flowers et al. | 313/362.1 |
| 3,200,019 | 8/1965 | Scott | 427/85 |
| 3,786,249 | 1/1974 | Anbar et al. | 250/424 |
| 4,264,642 | 4/1981 | Ferralli | 427/38 |
| 4,382,099 | 5/1983 | Legge et al. | 427/34 |
| 4,513,021 | 4/1985 | Purdes et al. | 427/38 |
| 4,524,303 | 6/1985 | Ritzl | 315/111.81 |

OTHER PUBLICATIONS

*VLSI Fabrication Principles,* S. K. Ghandi, John Wiley and Sons, Inc. (New York 1983), pp. 299–344.
*Ion Implantation Techniques,* H. Ryssel and H. Glawischnig, Editors, Springer-Verlag (New York 1982), pp. 3–8.

*Primary Examiner*—Donald J. Yusko
*Assistant Examiner*—Brian Palladino
*Attorney, Agent, or Firm*—Kenneth R. Glick

[57] ABSTRACT

An ion implantation apparatus includes an ion source, ion analyzer, ion acceleration means and ion deflection means interconnected in a sequential manner, but excludes a variable slit shutter as a means for attenuating the ion beam. A controllable source of inactive diluent gas is interconnected so as to provide a means for selecting the concentration of ions provided by the ion source to the ion analyzer.

6 Claims, 1 Drawing Sheet

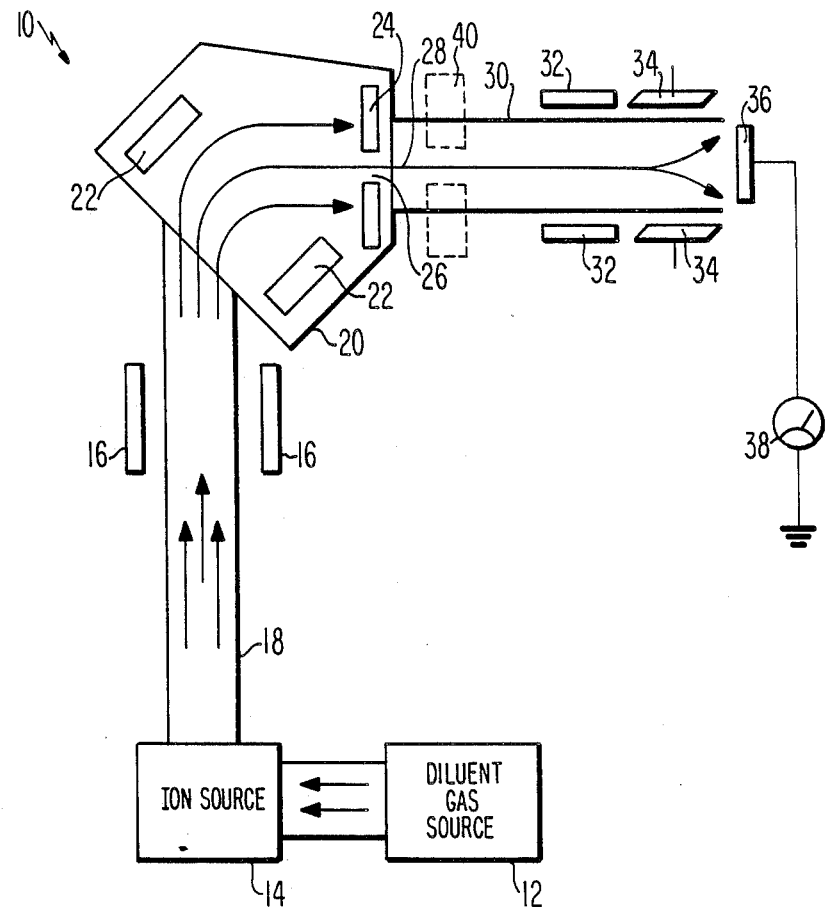

ION IMPLANTATION METHOD AND APPARATUS

This is a continuation of application Ser. No. 793,233, filed Oct. 31, 1985, now abandoned.

The present invention relates to a method and apparatus for implanting ions into a target substrate. More specifically, the invention relates to a method and apparatus for forming a substantially uniform, relatively low dosage implant of a dopant impurity species in a semiconductor wafer.

BACKGROUND OF THE INVENTION

Ion implantation is today a well established process used in the fabrication of solid state semiconductor devices. For example, see *VLSI Fabrication Principles,* S. K. Ghandhi, John Wiley and Sons, Inc. (New York 1983). Further elaboration on ion implantation processes as well as on the apparatus used therefor may be found in *Ion Implantation Techniques,* H. Ryssel and H. Glawischnig, Editors, Springer-Verlag (New York 1982). Basically, ion implantation apparatus comprises a source of ions, means for analyzing the source ions, means for accelerating the ions toward the target substrate and means for scanning the ion beam across the substrate. In the ion source, the dopant species to be implanted is provided in solid, liquid or gaseous form and is ionized. Similarly charged ions are elecgtrostatically extracted and are directed to the ion analyzer wherein they are separated by magnets so as to yield a beam of a particular ionic species. The ion beam which exits the ion analyzer is then again accelerated electrostatically and is directed between the deflection plates of a scanning system towards the target substrate.

The target substrate is typically connected to ground via a current measuring device known as a current integrator, which measures the parameter termed beam current. In order to operate in a stable fashion implantation system require that the ion source produce a certain minimum output. This minimum output corresponds to a typical beam current minimum value on the order of $10^{-6}$ amps. Other parameters being equal, the dosage of the ion implant is directly proportional to the beam current at the target. An effective low dosage implant requires a correspondingly low beam current. However, certain implantation steps in certain semiconductor fabrication processes, such as the conventional threshold voltage adjustment implant in metal oxide semiconductor field effect transistor (MOSFET) manufacture, require beam currents as low as $2.5 \times 10^{-8}$ amps so as to yield a dosages of approximately 1 to $5 \times 10^{10}$ ions/cm$^2$. Thus, since the ionization source yields a beam current of at least $10^{-6}$ amps, some beam attenuation means is required in order to achieve $2.5 \times 10^{-8}$ amps at the target.

The beam attenuation means conventionally takes the form of a shutter that includes a "variable slit" aperture in the beam path. However, such variable slit shutters create significant processing problems. The impinging ion beam causes sputtering and electrostatic charging of the shutter material, which in turn causes implantation non-uniformities due to beam distortion and contamination. Furthermore, a significantly attenuated beam presents a very narrow section, rendering the x-y scan of the beam on the target a critical, albeit difficult to uniformly control operation. In an effort to overcome the problems associated with performing low dosage ion implants, i.e. dosages less than approximately $1-5 \times 10^{10}$ ions/cm$^2$, the present invention was conceived.

SUMMARY OF THE INVENTION

An ion implantation apparatus includes an ion source, ion analyzer, ion acceleration means and ion deflection means interconnected in a sequential manner, but does not utilize a variable slit shutter as a means for attenuating the ion beam. A controllable source of inactive diluent gas is interconnected so as to provide a means for selecting the concentration of ions provided by the ion source to the ion analyzer.

BRIEF DESCRIPTION OF THE DRAWING

The drawing FIGURE is a schematic representation of a representative ion implantation apparatus that incorporates the present invention.

DETAILED DESCRIPTION OF PREFERRED EMBODIMENT

The drawing FIGURE illustrates an exemplary configuration for an ion implantation apparatus that includes the structure of the present invention. The ion implantation apparatus identified at 10 is substantially conventional in design but for the addition of a diluent gas source identified schematically at 12 and the exclusion or non use of a variable slit, beam attenuating shutter, as will subsequently be elaborated upon. The apparatus 10 includes an ion source 14 which may be of conventional configuration but for its interconnection with the dilent gas source 12.

The ion source 14 incorporates a supply of dopant material and means for ionizing the dopant material. The composition of the dopant is determined by the ion species which is to be implanted. For example, gaseous boron trifluoride (BF$_3$) is commonly used for boron implantation, gaseous phosphine (PH$_3$) is commonly used for phosphorus implantation and gaseous arsine (AsH$_3$) is commonly used for arsenic implantation. The ionizing means may be of conventional "hot filament" configuration, comprising a filament at one electrical potential surrounded by a cylinder at a second potential and by a magnetic coil. During operation, the filament is heated so as to emit electrons that bombard and ionize the source gas therearound. Appropriate manipulation of the magnetic coil causes the ions which are produced to trace a helical trajectory, thereby creating additional collisions and ionization of the source gas.

In the structure of the present invention, a controlled quantity of inactive diluent gas is introduced from the diluent gas source 12 into the ion source 14 so as to physically mix with the dopant source gas surrounding the filament. The diluent gas is inactive in that it does not chemically combine with the dopant source gas and can later readily be selectively filtered from the dopant species which is being implanted. For example, when the dopant source gas is BF$_3$ a suitable diluent gas would be nitrogen (N$_2$). The quantity of diluent gas that should be added is a direct function of the degree of beam attenuation required. For example, if the ion source in conventional operation (without a diluent gas) produces a $1 \times 10^{-6}$ amp beam current at the target, and it is desired to produce an implant dosage equivalent to a $2.5 \times 10^{-8}$ amp beam current, then the beam must be attenuated by a factor of 40 ($1 \times 10^{-6}/2.5 \times 10^{-8}$). In the case of BF$_3$ dopant gas and N$_2$ diluent, this can be achieved by a mixture comprising 2.5% BF$_3$ and 97.5% N$_2$.

The dopant ion species to be implanted, e.g. B+ in the case of boron, is extracted from the ion source by means of a first electrode 16 around a first acceleration tube 18. The desired ion species as well as all similarly charged ions, e.g. N$_2$+ when the diluent gas is nitrogen, are then accelerated through the first acceleration tube 18 and into an ion analyzer 20 as shown in the FIGURE.

The ion analyzer 20 is of conventional configuration and basically includes one or more magnets 22 and an ion selecting aperture plate 24. The ion analyzer 20 magnetically bends the entering ion beam 90° and thereby produces a spectrum of ions having different momentums impinging upon the ion selecting aperture plate 24. The ion selecting aperture plate 24 includes an aperture 26 which can selectively be moved so as to permit passage therethrough of a particular ion species from among the spectrum of species that are impinging upon the plate 24. Thus, a beam 28 of the selected ion species 28, B+ in the given example, exits the ion analyzer 20. The N$_2$+ ions are filtered out by the position of the ion selecting aperture plate 24. The beam 28 is then accelerated through a second acceleration tube 30 by means of a potential applied to a second electrode 32 which is positioned around the tube 30 at some fixed distance from the ion analyzer 20. The ion beam 28 then passes between the conductive plates of electrostatic deflection means 34, whereupon the beam is scanned in an x-y manner before it exits the second acceleration tube 30 and impinges upon a target substrate 36.

The target substrate 36 is connected to ground through a current integrator 38 so as to provide means for measuring beam current. The dosage of ions implanted, in ions per square centimeter, is related to the beam current by the relationship $$D = It/AQe$$

wherein

D is the dosage in ions/cm$^2$;

I is the beam current in microamps;

t is the exposure time in seconds;

A is the scanned target area in cm$^2$;

Q is the charge on the implanted species; and e is the elementary charge constant $1.60 \times 10^{-19}$ coulombs.

It may also be noted that a second commonly used parameter in ion implantation processes, termed ion energy and commonly measured in thousands or millions of electron volts, is equal to the ion charge (Q) multiplied by the cumulative potential on the first and second electrodes 16 and 32, typically measured in thousands or millions of volts. The ion energy determines the depth of the implant in the target substrate.

As previously indicated, the present invention has greatest utility when performing low dosage implants. In conventional ion implantation apparatus the beam current and hence, the implantation dosage is manipulated by three basic techniques: varying the voltage or current between the filament and surrounding cylinder in the ion source; adjusting the current through the magnetic coil in the ion source; and providing a variable slit shutter 40 between the ion analyzer and target. However, all of these conventional beam current manipulation techniques are problematical when seeking to achieve low dosage implants i.e., implants of less than approximately $1 \times 5 \times 10$ ions/cm$^2$. Reducing the filament/cylinder current or voltage in the ion source and reducing the current in the magnetic coil in the ion source are inefficient and yield beam currents having relatively high minimum values. When performing low dosage implants, the low beam current required may be less than the minimum values which can be reliably achieved by either of these techniques alone, therefore necessitating the use of a variable slit shutter 40 as well.

However, although a variable slit shutter 40 is used in all conventional ion implantation apparatus, it too presents significant drawbacks. Basically, a variable slit shutter 40 provides an aperture of preselected size through which the ion beam must pass, thereby permitting a preselected attenuation of that beam. However, this beam slitting, which is necessary in low dosage implants, inherently causes non-uniformity in the implant across the area of the target substrate, as previously indicated. The present invention permits low dosage implants and eliminates the need for a variable slit shutter. Furthermore, it provides a demonstrable improvement in the uniformity of a low dosage implant across a wafer and in the repeatability of the resistivity value achieved, as the test data below indicates.

All wafers were implanted with a $1.2 \times 10^{13}$ ion/cm$^2$ dose at 100 KeV and then annealed at 1050° C. for approximately 15 minutes. Wafers 1 and 2 utilized the invention. Wafer 3 utilized a conventional variable slit shutter to attenuate the ion beam. The test results cover a 3.3 inch diameter area on a 4 inch wafer.

| | AVERAGE FINAL RESISTIVITY ($\Omega/\square$) | STANDARD DEVIATION |
|---|---|---|
| Wafer 1 | 2832 | 1.12% |
| Wafer 2 | 2870 | 1.75% |
| Wafer 3 | 2449 | 2.39% |

The diluent gas source may be provided as a conventional tank of nitrogen gas interconnected by standard valve and regulator means to the ion source. Alternatively, one can use a tank which contains a premixed combination of source gas and diluent gas e.g. 10% BF$_3$, 90% N$_2$. Thus, the present invention can be readily implemented on existing ion implantation apparatus. Although actual experimentation has been performed with a BF$_3$ ion source gas and nitrogen diluent gas, one would expect that any similarly characterized ion source gas can be diluted in this manner. The diluent gas should be selected on the basic of its cost, its degree of non-interaction with the ion source gas, its stability, and the ease with which it can be resolved from a dopant species by the standard magnetic analysis that occurs in the ion analyzer. Lastly, it should be recognized that the drawing FIGURE represents a generalized configuration for an ion implantation apparatus and that the present invention is not limited to implantation on this specific apparatus.

What is claimed is:

1. In an ion implantation apparatus including an ion source, ion analyzer, ion acceleration means and deflection means interconnected in a sequential manner, the improvement comprising:

a controllable source of inactive diluent gas interconnected to the ion source so as to provide a means for selecting a concentration of dopant ions and diluent ions provided by the ion source to the ion analyzer, the diluent ions being of different mass than the dopant ions, the ion analyzer including an apertured plate that can be selectively moved so as to permit passage therethrough, based on the difference in mass thereof, of said copant ions while blocking passage of said diluent ions.

2. An apparatus in accordance with claim 1, wherein:
the ion source provides ions from the group consisting of boron, phosphorus and arsenic; and
the diluent gas is nitrogen.

3. An ion implantation apparatus in accordance with claim 1 wherein the controllable source of inactive diluent gas comprises a tank containing diluent gas having a valve and pressure regulator thereon.

4. A method for implanting dopant ions into a target substrate utilizing apparatus which includes an ion source, ion analyzer, ion acceleration means and deflection means interconnected in a sequential manner, comprising:

introducing an inactive diluent gas and a dopant gas to the ion source so as to select the concentration of ions provided by the ion source to the ion analyzer;

ionizing said diluent gas and said dopant gas so as to yield dopant ions and diluent ions, the dopant ions being of different mass than the diluent ions;

directing the dopant ions and diluent ions to the ion analyzer; and filtering the ions within the ion analyzer so as to yield an exit beam of only said dopant ions directed toward the target substrate.

5. A method in accordance with claim 4, wherein:
the ion source provides ions from the group consisting of boron, phosphorus and arsenic; and
the diluent gas is nitrogen.

6. A method in accordance with claim 4, comprising:
selecting an ion beam current by selecting the quantity of diluent gas introduced to the ion source.

* * * * *